(12) United States Patent
Hata

(10) Patent No.: US 7,439,551 B2
(45) Date of Patent: Oct. 21, 2008

(54) NITRIDE-BASED COMPOUND SEMICONDUCTOR LIGHT EMITTING DEVICE

(75) Inventor: Toshio Hata, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/178,201

(22) Filed: Jul. 8, 2005

(65) Prior Publication Data

US 2006/0006398 A1    Jan. 12, 2006

(30) Foreign Application Priority Data

Jul. 8, 2004    (JP) ............... 2004-201743

(51) Int. Cl.
*H01L 33/00*    (2006.01)

(52) U.S. Cl. ............... 257/98; 257/79; 257/99; 257/E33.068; 257/E33.075

(58) Field of Classification Search ............ 257/79, 257/94, 99, E33.075, E33.068, E33.064, 257/98; 438/46, 47
See application file for complete search history.

(56) References Cited

U.S. PATENT DOCUMENTS

| | | | |
|---|---|---|---|
| 4,605,942 | A | 8/1986 | Camlibel et al. |
| 6,169,294 | B1 | 1/2001 | Biing-Jye et al. |
| 6,177,352 | B1 | 1/2001 | Schonfeld et al. |
| 6,197,609 | B1 | 3/2001 | Tsutsui |
| 6,201,264 | B1 | 3/2001 | Khare |
| 6,320,206 | B1 | 11/2001 | Coman |
| 6,562,648 | B1 | 5/2003 | Wong |
| 6,573,537 | B1 | 6/2003 | Steigerwald |
| 6,613,461 | B1 | 9/2003 | Sugahara |
| 6,727,518 | B2 | 4/2004 | Uemura |
| 6,800,500 | B2 * | 10/2004 | Coman et al. ............... 438/22 |
| 6,967,117 | B2 * | 11/2005 | Horng et al. ............... 438/22 |
| 7,019,323 | B2 * | 3/2006 | Shakuda et al. ............... 257/13 |
| 2002/0134987 | A1 | 9/2002 | Takaoka |
| 2005/0104081 | A1 * | 5/2005 | Kim et al. ............... 257/99 |
| 2005/0199885 | A1 | 9/2005 | Hata et al. |
| 2005/0242361 | A1 | 11/2005 | Bessho et al. |
| 2006/0006398 | A1 | 1/2006 | Hata |
| 2006/0017060 | A1 | 1/2006 | Chen |
| 2006/0043387 | A1 | 3/2006 | Hata |
| 2006/0043405 | A1 | 3/2006 | Hata |
| 2006/0046328 | A1 | 3/2006 | Raffetto |
| 2006/0145159 | A1 * | 7/2006 | Yokoyama et al. ............ 257/72 |

(Continued)

FOREIGN PATENT DOCUMENTS

JP    09-008403    1/1997

(Continued)

OTHER PUBLICATIONS

U.S. Office Action dated Apr. 18, 2007, directed to related U.S. Appl. No. 11/216,547.

(Continued)

*Primary Examiner*—Matthew C Landau
(74) *Attorney, Agent, or Firm*—Morrison & Foerster LLP (57) ABSTRACT

The nitride-based compound semiconductor light emitting device includes a first ohmic electrode, a bonding metal layer, a second ohmic electrode, a nitride-based compound semiconductor layer, and a transparent electrode stacked in this order on a support substrate, and further includes an ohmic electrode formed on a back side of the support substrate.

8 Claims, 5 Drawing Sheets

U.S. PATENT DOCUMENTS

2006/0151801 A1 * 7/2006 Doan et al. ................ 257/99
2006/0226434 A1   10/2006 Hata
2006/0231852 A1   10/2006 Kususe

FOREIGN PATENT DOCUMENTS

| JP | 2000-252224 | 9/2000 |
|----|-------------|--------|
| JP | 2003-347587 | 12/2003 |
| JP | 2004-72052  | 3/2004 |
| JP | 2004-266240 | 9/2004 |
| JP | 2005-311034 | 11/2005 |
| JP | 2006-049871 | 2/2006 |
| JP | 2006-073619 | 3/2006 |
| JP | 2006-073822 | 3/2006 |

OTHER PUBLICATIONS

U.S. Office Action dated Jul. 30, 2007, directed to related U.S. Appl. No. 11/219,139.

U.S. Office Action mailed Feb. 22, 2008, directed to related U.S. Appl. No. 11/219,139, 12 pages.

U.S. Office Action mailed Mar. 18, 2008, directed to related U.S. Appl. No. 11/403,511. (6 pages).

U.S. Office Action, mailed Jun. 11, 2008, directed to related U.S. Appl. No. 11/219,139, 13 pages.

* cited by examiner

NITRIDE-BASED COMPOUND SEMICONDUCTOR LIGHT EMITTING DEVICE

This nonprovisional application is based on Japanese Patent Application No. 2004-201743 filed with the Japan Patent Office on Jul. 8, 2004, the entire contents of which are hereby incorporated by reference.

BACKGROUND OF THE INVENTION

1. Field of the Invention

The present invention relates to a nitride-based compound semiconductor light emitting device capable of emitting light in the blue to ultraviolet range, and a fabricating method thereof. More particularly, the present invention relates to a nitride-based compound semiconductor light emitting device having a conductive substrate bonded thereto and a fabricating method thereof.

2. Description of the Background Art

A nitride-based compound semiconductor, represented by $In_xGa_yAl_zN$ ($x+y+z=1$, $0 \leq x < 1$, $0 < y \leq 1$, $0 \leq z < 1$), for example, has a large energy bandgap and high thermal stability, and allows control of the bandgap width by adjusting composition thereof. Accordingly, the nitride-based compound semiconductor has attracted attention as a material that can be applied to various kinds of semiconductor devices, such as a light emitting device, a high-temperature device and others.

In particular, as for a light emitting diode using the nitride-based compound semiconductor, a device having luminous intensity of some cd grades in the blue to green wavelength range has already been developed and brought to practical use. As for a pickup light source for large-capacity optical disk media, practical application of a laser diode using the nitride-based compound semiconductor is becoming an objective of research and development.

Figure 5:
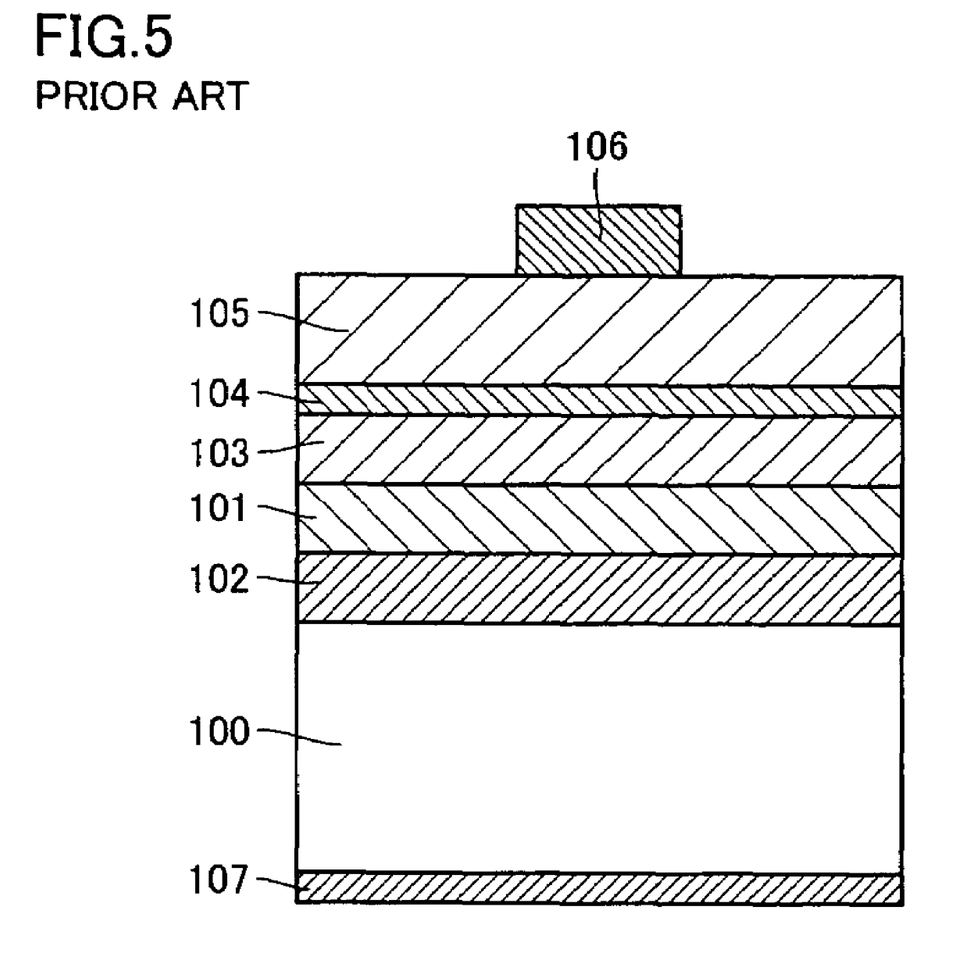
FIG. 5 is a schematic cross sectional view of a conventional compound semiconductor light emitting device.

Japanese Patent Laying-Open No. 09-008403 discloses a device structure of such a laser or light emitting diode. Specifically, as shown in FIG. 5, on a conductive substrate 100 having a positive electrode 107 formed, a first ohmic electrode 102 and a second ohmic electrode 101 are formed. A P-type layer 103 of gallium nitride-based semiconductor, an active layer 104 and an N-type layer 105 are stacked successively thereon, and a negative electrode 106 is formed further thereon. Here, first ohmic electrode 102 and second ohmic electrode 101 are bonded together by hot pressure bonding.

As such, in the conventional technique as described in Japanese Patent Laying-Open No. 09-008403, an ohmic electrode is formed on a conductive substrate, and hot pressure bonding or the like is used for bonding of the gallium nitride-based semiconductor layer.

With such a technique, however, the conductive substrate may peel off from the ohmic electrode due to poor adhesion therebetween. If the conductive substrate and the ohmic electrode are separated from each other completely, it is not possible to remove a sapphire substrate, hindering formation of a light emitting device. If they are partially separated from each other, flow of the current from the gallium nitride-based semiconductor layer to the conductive substrate will be difficult, leading to an increase of operating voltage, thereby causing degradation in reliability of the light emitting device.

Further, the partially peeled-off state will cause penetration of solvent, resist, or etchant during the process. For example, upon fabrication of a lamp light emitting device, resin, water or the like will enter through the peeled-off part, which will expand the peeling, possibly destroying the ohmic electrode. This would degrade reliability of the light emitting device.

Still further, when Au wire is bonded to a pad electrode, if adhesion between the conductive substrate and the ohmic electrode formed thereon is poor, there will occur peeling of the conductive substrate from the ohmic electrode, thereby causing an increase of operating voltage.

SUMMARY OF THE INVENTION

The present invention has been made to solve the above-described problems of the conventional techniques, and an object of the present invention is to provide a highly reliable nitride-based compound semiconductor light emitting device by ensuring good adhesion between a conductive substrate and an ohmic electrode, and a fabricating method thereof.

A nitride-based compound semiconductor light emitting device according to the present invention includes: a support substrate; a first ohmic electrode formed on the support substrate; a bonding metal layer formed on the first ohmic electrode; a second ohmic electrode formed on the bonding metal layer; a nitride-based compound semiconductor layer formed on the second ohmic electrode; a transparent electrode formed on an approximately entire upper surface of the semiconductor layer; and an ohmic electrode formed on a back side of the support substrate.

Preferably, the nitride-based compound semiconductor layer has at least a P-type layer, a light emitting layer and an N-type layer stacked in this order from the side of the support substrate.

Preferably, the support substrate is conductive and formed of at least one of Si, GaAs and GaP, and has resistivity in a range from $10^{-4}$ Ωcm to 10 Ωcm.

Alternatively, the support substrate is conductive and formed of at least one of CuW, CuAg and CuMo, and has thermal conductivity in a range from 1.5 W/cm·k to 2.5 W/cm·k.

Preferably, the bonding metal layer consists of at least two layers formed of same or different materials with respect to each other.

Preferably, the bonding metal layer is formed of a metal selected from Au, Sn, AuSn and Au—Ge.

In the case where the bonding metal layer consists of at least two layers, they are preferably formed of at least two different metals selected from Au, Sn, AuSn and Au—Ge.

Preferably, a reflecting layer for reflecting light from the light emitting layer is formed between the second ohmic electrode and the bonding metal layer.

Preferably, the second ohmic electrode has a thickness in a range from 1 nm to 15 nm.

Preferably, the nitride-based compound semiconductor layer is stacked on an insulative substrate of sapphire, spinel or lithium niobate, or on a conductive substrate of silicon carbide, silicon, zinc oxide or gallium arsenide.

Preferably, the insulative substrate or the conductive substrate is removed by grinding, polishing or laser lift-off.

A fabricating method of a nitride-based compound semiconductor light emitting device according to another aspect of the present invention includes the steps of: forming a nitride-based compound semiconductor layer on a substrate; forming a second ohmic electrode on the nitride-based compound semiconductor layer; forming a second bonding metal layer on the second ohmic electrode; forming a first ohmic electrode on a support substrate; forming a first bonding metal layer on the first ohmic electrode; bonding the first bonding metal layer and the second bonding metal layer; removing the substrate to expose a surface of the nitride-based compound semiconductor layer; and forming a transparent electrode on the exposed surface.

Preferably, the step of forming the nitride-based compound semiconductor layer on the substrate includes the step of stacking at least an N-type layer, a light emitting layer and a P-type layer in this order from the substrate side.

Preferably, the fabricating method of a nitride-based compound semiconductor light emitting device further includes the step of forming a reflecting layer on the second ohmic electrode between the step of forming the second ohmic electrode and the step of forming the second bonding metal layer, wherein the step of forming the second bonding metal layer includes the step of forming the second bonding metal layer on the reflecting layer.

Preferably, the fabricating method of a nitride-based compound semiconductor light emitting device further includes the steps of: removing a part of the nitride-based compound semiconductor layer to expose the second ohmic electrode; irradiating the exposed surface with laser light; forming a scribe line from the support substrate side opposite to the portion irradiated with the laser light; and performing dividing along the scribe line.

According to the nitride-based compound semiconductor light emitting device and the fabricating method thereof of the present invention, the bonding metal layer prevents a short circuit, so that the yield during the process is improved. Further, the leakage current in the device is reduced, ensuring good reliability. Still further, the P-type layer in the nitride-based compound semiconductor layer can attain characteristics as the P-type layer during removal of the substrate, without the need of a heat treatment step, resulting in simplification of the process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A nitride-based compound semiconductor light emitting device of the present invention includes a support substrate, a first ohmic electrode formed on the support substrate, a bonding metal layer formed on the first ohmic electrode, a second ohmic electrode formed on the bonding metal layer, a nitride-based compound semiconductor layer formed on the second ohmic electrode, a transparent electrode formed on an approximately entire upper surface of the semiconductor layer, and an ohmic electrode formed on a back side of the support substrate. It is particularly characterized in that the bonding metal layer is formed.

Formation of the bonding metal layer between the first and second ohmic electrodes in this manner can prevent peeling of the ohmic electrodes, and thus, a highly reliable light emitting device is obtained.

Figure 1:
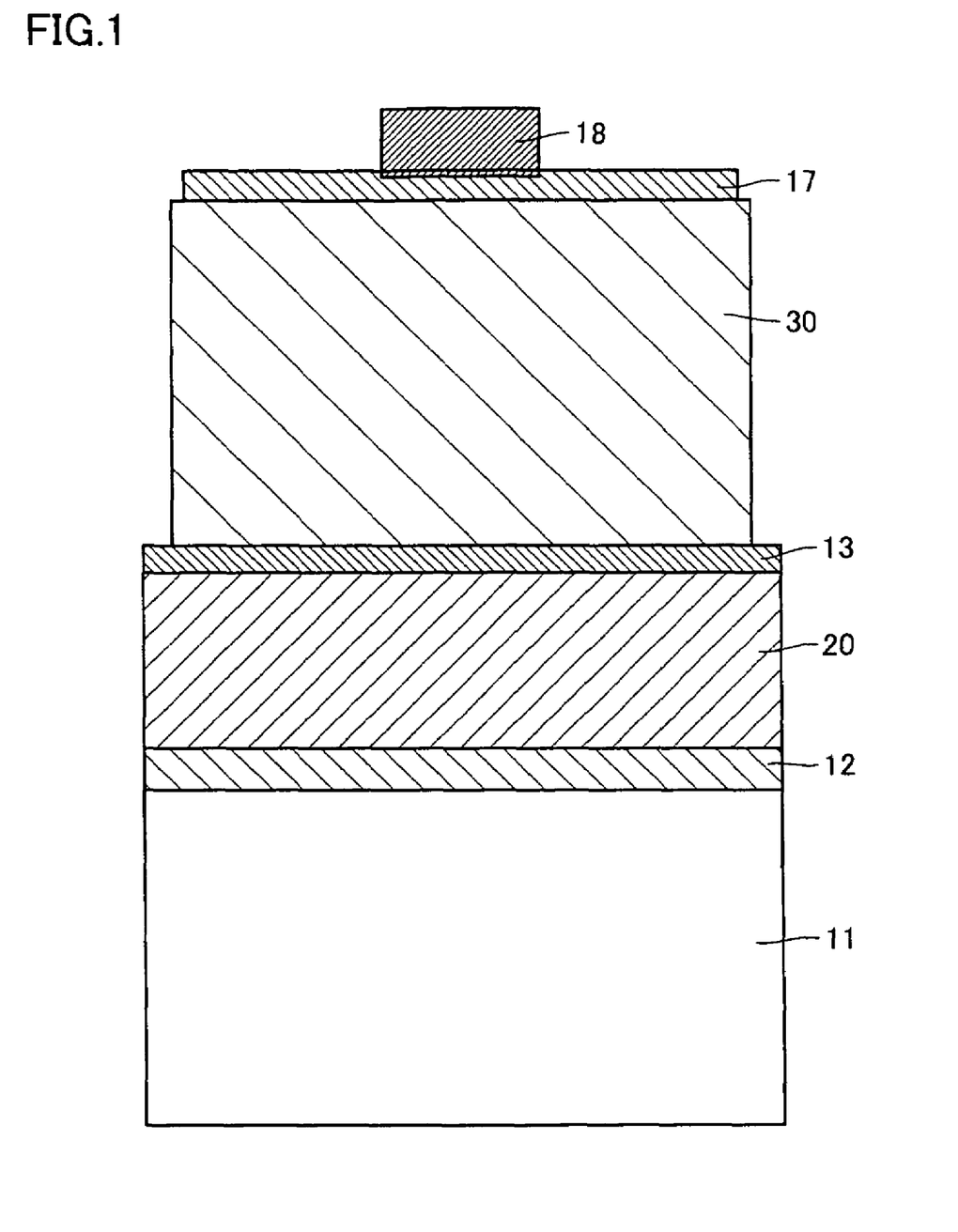
FIG. 1 is a schematic cross sectional view of a nitride-based compound semiconductor light emitting device according to the present invention.

Hereinafter, the present invention will be explained in detail with reference to the drawings. FIG. 1 is a schematic cross sectional view of a nitride-based compound semiconductor light emitting device of the present invention. The nitride-based compound semiconductor light emitting device of the present invention includes a first ohmic electrode 12, a bonding metal layer 20, a second ohmic electrode 13, a nitride-based compound semiconductor layer 30, a transparent electrode 17, and a pad electrode 18, successively formed in this order on a support substrate 11. Here, a reflecting metal layer 19 is preferably formed between bonding metal layer 20 and second ohmic electrode 13.

Figure 2:
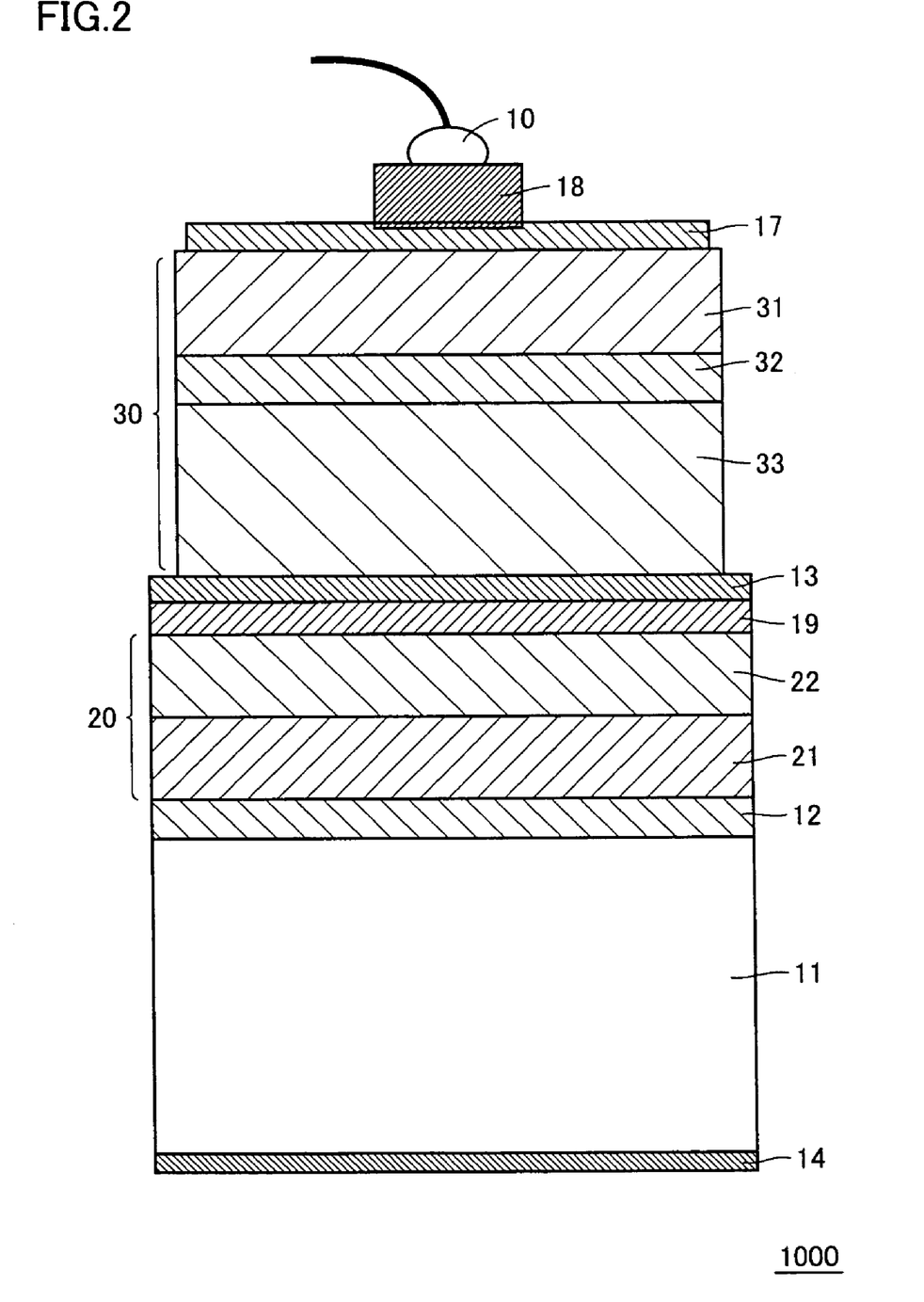
FIG. 2 is a schematic cross sectional view of a specific example of the nitride-based compound semiconductor light emitting device of the present invention.

Still preferably, in the nitride-based compound semiconductor light emitting device of FIG. 1, an ohmic electrode 14 is formed on a back side of support substrate 11, as shown in FIG. 2, and wire bonding 10 is formed on pad electrode 18.

In the present invention, bonding metal layer 20 is preferably formed of two layers, which can be, e.g., a first bonding metal layer 21 and a second bonding metal layer 22, as shown in FIG. 2.

Further, in the present invention, nitride-based compound semiconductor layer 30 is formed of a P-type layer 33, a light emitting layer 32 and an N-type layer 31 stacked in this order from the support substrate side, as shown in FIG. 2, to make it function as a light emitting device.

In the present invention, CuW, CuAg or CuMo may be used for support substrate 11. In this case, thermal conductivity of the support substrate is preferably in the range of not greater than 2.5 W/cm·k. If it exceeds 2.5 W/cm·k, heat will be generated when a large current flows through the light emitting device, leading to degradation in reliability of the light emitting device. A material of CuW, CuAg or CuMo having the thermal conductivity of approximately 1.5 W/cm·k is more preferable.

Further, in the present invention, Si, GaAs or GaP may also be used for support substrate 11. In this case, resistivity of the support substrate is preferably in the range of not lower than $10^{-4}$ Ωcm and not greater than 10 Ωcm. A substrate having the resistivity of lower than $10^{-4}$ Ωcm is difficult to fabricate. If it exceeds 10 Ωcm, ohmic contact with the ohmic electrode will be degraded to cause a voltage increase, leading to an increase of the driving voltage of the light emitting device. The resistivity is more preferably in the range of not lower than $10^{-3}$ Ωcm and not greater than $10^{-2}$ Ωcm.

The support substrate preferably has a thickness of not less than 50 μm and not more than 500 μm. If it exceeds 500 μm, dividing into chips may be difficult. If it is less than 50 μm, handling of chips will be difficult.

In the present invention, Al, Cr, Ti, In, or Ti—Al may be used for the first ohmic electrode, although not restricted thereto.

In the present invention, the bonding metal layer is provided to ensure good adhesion between the first and second ohmic electrodes, as will be described later. As the bonding metal layer, Au, Sn, AuSn or Au—Ge may be used. In the case of the bonding metal layer formed of two or more layers, same or different materials may be used for the layers, or same or different materials selected from the above materials may be combined as appropriate for the respective layers.

Here, the case of the bonding metal layer formed of two or more layers may include the case as follows. In the process of forming a bonding metal layer, a first bonding metal layer is formed in advance on the first ohmic electrode, and a second bonding metal layer is formed in advance on the second ohmic electrode, and the first and second bonding metal layers are bonded together, in which case the bonding metal layer consists of two layers.

In the present invention, Pd, Ni, or Ni—Au may be used for the second ohmic electrode, although not restricted thereto. The second ohmic electrode preferably has a thickness of not less than 1 nm and not more than 15 nm. If it exceeds 15 nm, transmission of emitted light may become insufficient. If it is less than 1 nm, ohmic contact may be degraded.

In the present invention, the nitride-based compound semiconductor can emit light in the blue to ultraviolet range. Such a nitride-based compound semiconductor may be $In_xAl_yGa_{1-x-y}$ ($0 \leq x$, $0 \leq y$, $x+y \leq 1$), although not restricted thereto. The nitride-based compound semiconductor layer of the present invention includes an N-type layer, a light emitting layer and a P-type layer from the substrate side. These layers may be fabricated using any of known methods, which may include metalorganic chemical vapor deposition (MOCVD), molecular beam epitaxy (MBE) and others.

Figure 3:
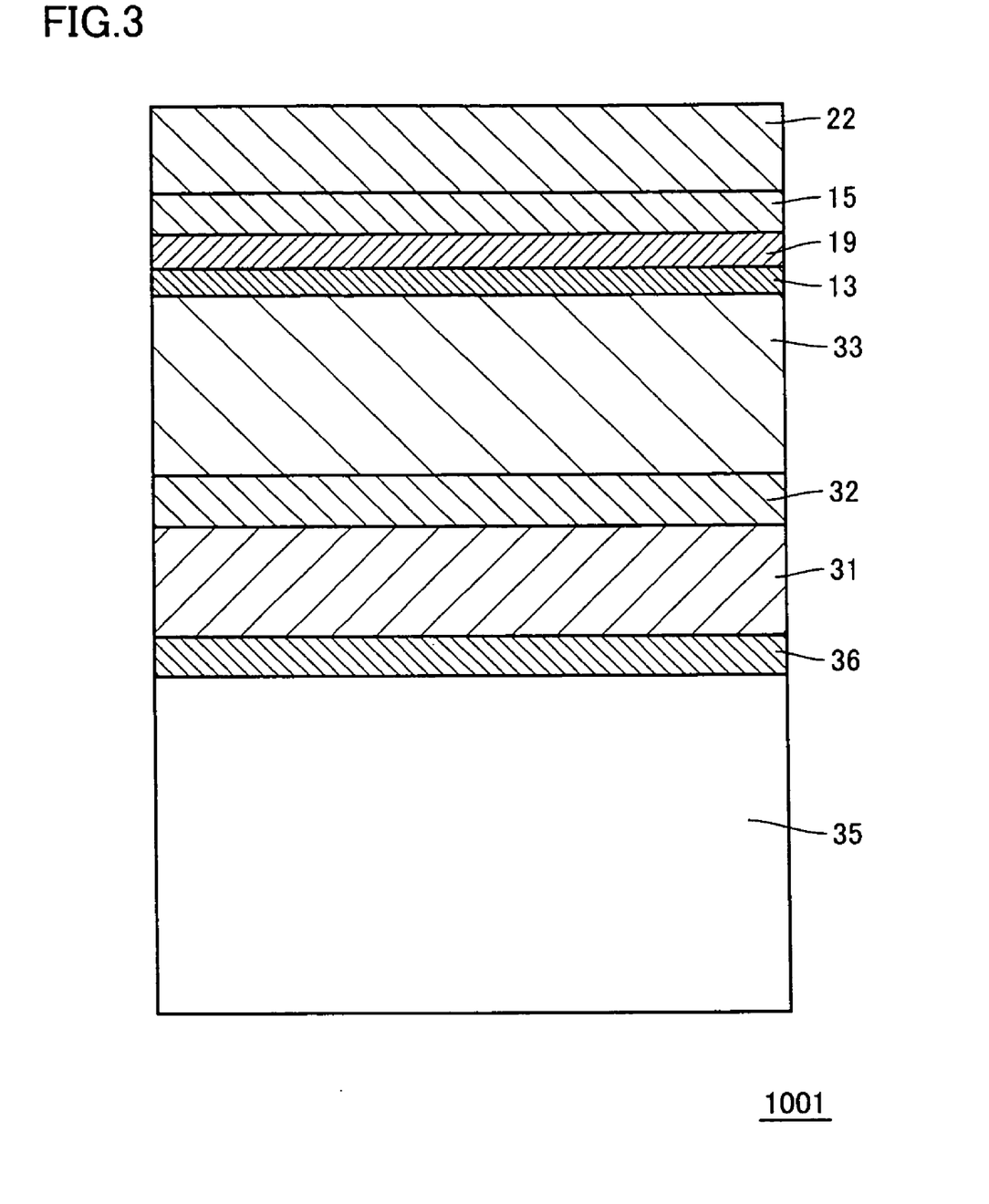
FIG. 3 is a schematic cross sectional view of a specific example of a nitride-based compound semiconductor layer according to the present invention.

In the present invention, the N-type layer, the light emitting layer and the P-type layer constituting the nitride-based compound semiconductor layer are preferably formed before being bonded to the first ohmic electrode. More specifically, as shown in FIG. 3, a buffer layer 36, an N-type layer 31, a light emitting layer 32 and a P-type layer 33 are stacked in this order on a substrate 35 to form the nitride-based compound semiconductor layer. Then, on the P-type layer, second ohmic electrode 13, a reflecting layer 19, a barrier layer 15, and second bonding metal layer 22 are formed in this order by evaporation or the like. Thereafter, second bonding metal layer 22 is bonded to first bonding metal layer 21.

The substrate may be an insulative substrate such as sapphire, spinel or lithium niobate, or may be a conductive substrate such as silicon carbide, silicon, zinc oxide or gallium arsenide. The substrate can be removed by grinding, polishing or laser lift-off.

The reflecting layer is for reflecting the light from the light emitting layer upward. The reflecting layer may be formed of Ag, Al, or a rare-earth element (Nd or the like) mixed with Ag, although not restricted thereto.

The barrier layer is for preventing the bonding metal from entering the reflecting layer. The barrier layer may be formed of Mo, Ni, Ti, or Ni—Ti, although not restricted thereto. The barrier layer preferably has a thickness of not less than 5 nm. If it is less than 5 nm, the thickness of the barrier layer may become uneven, in which case the bonding metal may enter the reflecting layer through the region where the barrier layer is not formed.

In the present invention, the transparent electrode may be formed of Pd, Ni or Ni—Au, and may have a thickness of not less than 1 nm and not more than 15 nm. If it exceeds 15 nm, emitted light may not be transmitted upward. If it is less than 1 nm, ohmic contact may be degraded. Further, a transparent film of conductor such as ITO may also be used.

Hereinafter, a fabricating method of the nitride-based compound semiconductor light emitting device of the present invention will be described. The fabricating method of the nitride-based compound semiconductor light emitting device of the present invention includes the step of forming a nitride-based compound semiconductor layer on a substrate, the step of forming a second ohmic electrode on the nitride-based compound semiconductor layer, the step of forming a second bonding metal layer on the second ohmic electrode, the step of forming a first ohmic electrode on a support substrate, the step of forming a first bonding metal layer on the first ohmic electrode, the step of bonding the first and second bonding metal layers together, the step of removing the substrate to expose a surface of the nitride-based compound semiconductor layer, and the step of forming a transparent electrode on the exposed surface.

The fabricating method of the present invention is characterized in that the nitride-based compound semiconductor layer, the second ohmic electrode and the second bonding metal layer are formed in advance on the substrate, and this structure is bonded to the structure of the support substrate side including the support substrate, the first ohmic electrode and the first bonding metal layer, as explained above.

In this manner, the electrodes can be formed at the top and the bottom of the device, and they are bonded together via the bonding metal layers. This prevents peeling of the ohmic electrodes and ensures good adhesion. Accordingly, a highly reliable light emitting device can be obtained.

In the fabricating method of the present invention, the steps of forming the first ohmic electrode and the first bonding metal layer on the support substrate may be carried out by an electron beam (EB) evaporation, sputtering, or resistive thermal evaporation. Further, the step of forming the second ohmic electrode on the nitride-based compound semiconductor layer may be carried out by EB evaporation or the like.

Further, in the fabricating method of the present invention, the first bonding metal layer and the second bonding metal layer may be bonded together by using eutectic bonding. In this case, the temperature and the pressure may be set as appropriate according to the materials being used.

In the fabricating method of the present invention, the step of removing a part of the nitride-based compound semiconductor layer to expose the second ohmic electrode may be carried out using reactive ion etching (RIE), for example. Further, the step of irradiating the exposed surface with laser light may be carried out by irradiation with laser light having the wavelength of 355 nm or 1064 nm. Further, the step of forming a scribe line from the back side of the support substrate opposite to the portion irradiated with the laser light may be carried out by a technique using a scriber of an infrared transmission type to form a scribe line oppositely facing the groove formed by irradiating with the laser light. Still further, the step of performing dividing along the scribe line may be carried out by breaking.

Hereinafter, the present invention will be explained in detail with reference to examples. It is noted that the present invention is not restricted thereto.

EXAMPLE 1

On a Si substrate serving as support substrate 11, a Ti (15 nm)/Al (150 nm) layer serving as first ohmic electrode 12 and an Au (3 μm) layer serving as first bonding metal layer 21 were formed in this order by EB evaporation.

Next, on a sapphire substrate serving as substrate 35, buffer layer 36, N-type nitride-based compound semiconductor layer 31, light emitting layer 32, and P-type nitride-based compound semiconductor layer 33 were formed successively by MOCVD. Specifically, a GaN buffer layer serving as buffer layer 36 was formed to a thickness of 20 nm, N-type nitride-based compound semiconductor layer 31 was formed to a thickness of 7 μm, a multi-quantum well (MQW) light emitting layer serving as light emitting layer 32 was formed to a thickness of 50 nm, and P-type nitride-based compound semiconductor layer 33 was formed to a thickness of 200 nm, successively in this order.

Next, on P-type nitride-based compound semiconductor layer 33, second ohmic electrode 13, reflecting metal layer 19, barrier metal layer 15, and second bonding metal layer 22 were formed by evaporation. Specifically, from the side of P-type nitride-based compound semiconductor layer 33, Pd serving as second ohmic electrode 13 was formed to a thickness of 3 nm, Ag serving as reflecting metal layer 19 was formed to a thickness of 150 nm, Mo serving as barrier metal layer 15 was formed to a thickness of 50 nm, and Au and AuSn serving as second bonding metal layer 22 were formed to thicknesses of 100 nm and 3 μm, respectively, successively in this order by EB evaporation. Here, Sn contained in AuSn was 20 mass %.

Next, first bonding metal layer 21 was bonded to second bonding metal layer 22 on P-type nitride-based compound semiconductor layer 33. Specifically, Au and AuSn were made to face each other to bond them by eutectic bonding at a temperature of 290° C. and a pressure of 200 N/cm².

Figure 4:
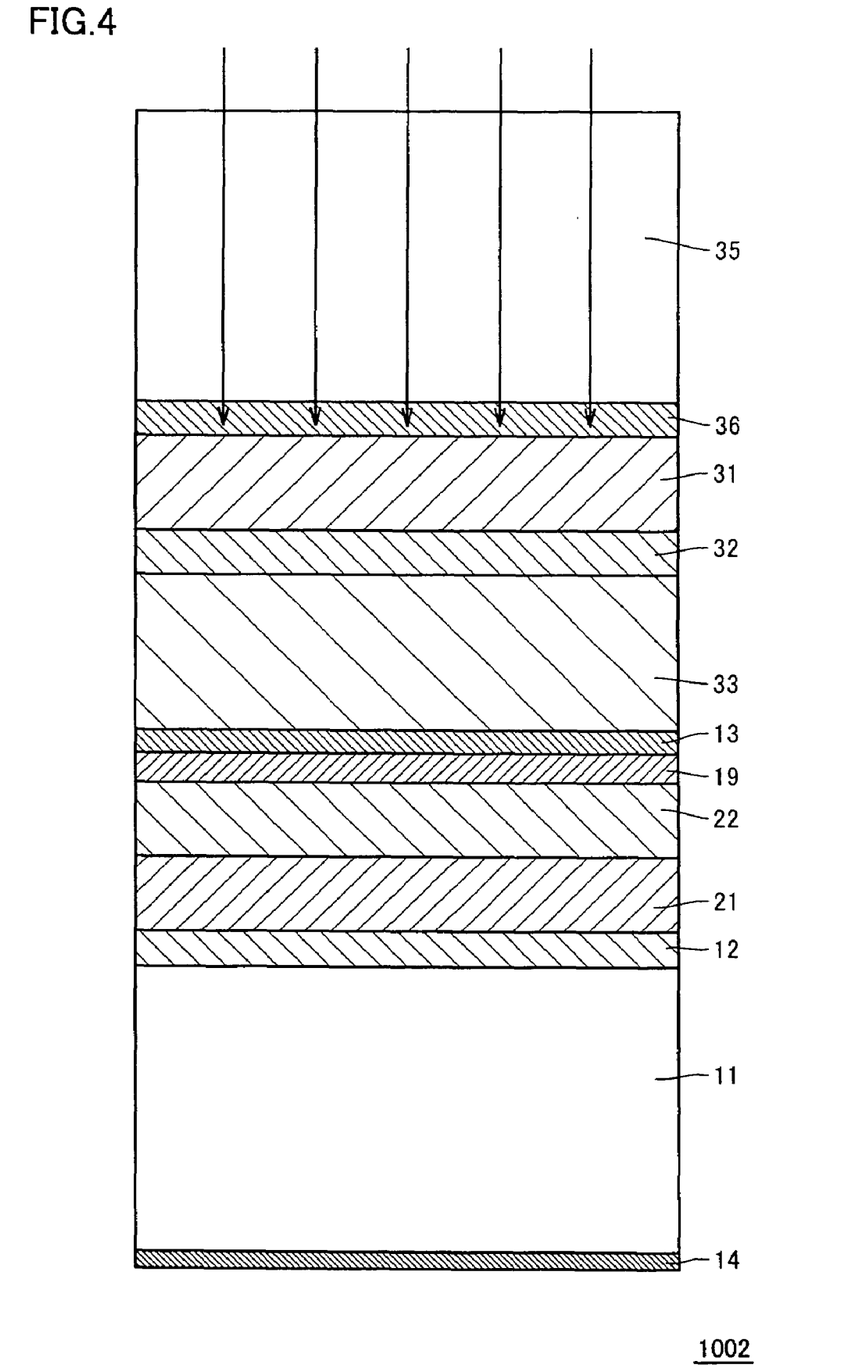
FIG. 4 is a schematic cross sectional view illustrating a process of removing a substrate of the nitride-based compound semiconductor light emitting device according to the present invention.

Thereafter, the sapphire substrate serving as substrate 35 was removed as shown in FIG. 4. Specifically, YAG-THG laser light (of 355 nm in wavelength) shown by arrows in FIG. 4 was irradiated from the sapphire substrate side for thermal decomposition of the sapphire substrate, GaN buffer layer 36 and a part of N-type nitride-based compound semiconductor layer 31, to remove the sapphire substrate.

On N-type nitride-based compound semiconductor layer 31 thus exposed by removal of the sapphire substrate, transparent electrode 17 (ITO of 150 nm in thickness) was formed, and bonding pad 18 was also formed approximately at the center of transparent electrode 17. Au wire serving as wire bonding 10 was ball-bonded on bonding pad 18. The fabrication process of the light emitting device was thus completed.

Next, using RIE, the nitride-based compound semiconductor layer fabricated through the above process was removed in the form of a groove so as to expose the second ohmic electrode. The metal surface thus exposed was irradiated with the laser light described above, to form a groove (20 μm in depth and 15 μm in width) through the metal layer(s) to reach the support substrate. Thereafter, a scribe line (dividing line) was formed from the back side of the support substrate opposite to the portion irradiated with the laser light, and the stack was divided along the scribe line into chips.

According to the nitride-based compound semiconductor light emitting device of the present invention fabricated as described above, to form the relatively thick N-type nitride-based compound semiconductor layer, the light emitting layer and the P-type nitride-based compound semiconductor layer on the support substrate using the Si material, the bonding metal layer functions to prevent a short circuit, so that the yield during the process is increased. A leakage current of the device is also reduced, so that it is possible to fabricate a highly reliable nitride-based compound semiconductor light emitting device. Compared to the conventional case where heat treatment was necessary to make the P-type nitride-based compound semiconductor layer attain the P-type characteristics, in the present invention, such P-type characteristics can be attained during the laser irradiation for removal of the sapphire substrate. This eliminates the need of the heat treatment step, and further simplifies the process.

EXAMPLE 2

On a CuW substrate serving as support substrate 11, a Ti (15 nm)/Al (150 nm) layer serving as first ohmic electrode 12 and an Au (3 μm) layer serving as first bonding metal layer 21 were formed in this order by EB evaporation.

Next, on a sapphire substrate serving as substrate 35, buffer layer 36, N-type nitride-based compound semiconductor layer 31, light emitting layer 32, and P-type nitride-based compound semiconductor layer 33 were formed successively, using MOCVD. Specifically, a GaN buffer layer serving as buffer layer 36 was formed to a thickness of 20 nm, N-type nitride-based compound semiconductor layer 31 was formed to a thickness of 5 μm, an MQW light emitting layer serving as light emitting layer 32 was formed to a thickness of 50 nm, and P-type nitride-based compound semiconductor layer 33 was formed to a thickness of 200 nm, successively in this order.

Next, second ohmic electrode 13, reflecting metal layer 19, barrier metal layer 15 and second bonding metal layer 22 were formed by evaporation on P-type nitride-based compound semiconductor layer 33. Specifically, from the side of P-type nitride-based compound semiconductor layer 33, Pd serving as second ohmic electrode 13 was formed to 3 nm in thickness, Ag—Nd serving as reflecting metal layer 19 was formed to 150 nm in thickness, Ni—Ti serving as barrier metal layer 15 was formed to 50 nm in thickness, and AuSn serving as second bonding metal layer 22 was formed to 3 μm in thickness, successively by EB evaporation.

Next, first bonding metal layer 21 and second bonding metal layer 22 on P-type nitride-based compound semiconductor layer 33 were bonded together. Specifically, Au and AuSn were made to face each other to bond them by eutectic bonding at a temperature of 320° C. and a pressure of 200 N/cm².

Thereafter, the sapphire substrate serving as substrate 35 was removed as shown in FIG. 4. Specifically, YAG-THG laser light (of 355 nm in wavelength) shown by arrows in FIG. 4 was irradiated from the sapphire substrate side for thermal decomposition of the sapphire substrate, GaN buffer layer 36 and a part of N-type nitride-based compound semiconductor layer 31, to remove the sapphire substrate.

On N-type nitride-based compound semiconductor layer 31 thus exposed by removal of the sapphire substrate, transparent electrode 17 (ITO of 150 nm in thickness) was formed, and bonding pad 18 was also formed approximately at the center of transparent electrode 17. Au wire serving as wire bonding 10 was ball-bonded on bonding pad 18. The fabrication process of the light emitting device was thus completed.

Next, using RIE, the nitride-based compound semiconductor layer fabricated in the above-described process was removed in the form of a groove, to expose the second ohmic electrode. The metal surface thus exposed was irradiated with the above-described laser light, to form a groove (of 20 μm in depth and 15 μm in width) through the metal layer(s) to reach the support substrate. Thereafter, a scribe line (dividing line) was formed from the back side of the support substrate opposite to the portion irradiated with the laser light, and the stack was divided along the scribe line into chips.

According to the nitride-based compound semiconductor light emitting device of the present invention fabricated as described above, CuW exhibiting good thermal conductivity is used as the support substrate instead of Si. CuW, CuAg, CuMo and the like having good thermal conductivities are advantageous in that when the side opposite from the support substrate is irradiated with laser light to remove the sapphire substrate, heat generated by the laser irradiation can be dissipated efficiently, so that thermal damage to the light emitting layer due to the laser irradiation is reduced. Further, as in the case of Example 1, the heat treatment step, conventionally required to make the P-type nitride-based compound semiconductor layer attain the P-type characteristics, is unnecessary in the present invention, since such P-type characteristics can be obtained during the laser irradiation for removal of the sapphire substrate, so that the process is further simplified. Still further, with good heat dissipation ensured, a large current can be made to flow, so that a nitride-based compound semiconductor light emitting device of high power can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based compound semiconductor light emitting device, comprising:
    a support substrate;
    a first ohmic electrode formed on the support substrate;
    a bonding metal layer formed on the first ohmic electrode;
    a reflecting layer formed on the bonding metal layer;
    a second ohmic electrode formed on the reflecting layer;
    a nitride-based compound semiconductor layer formed directly on an upper surface of the second ohmic electrode,
    wherein the upper surface of the second ohmic electrode is exposed adjacent to opposing sides of the nitride-based compound semiconductor layer;
    a transparent electrode formed on an approximately entire upper surface of the semiconductor layer; and
    an ohmic electrode formed on a back side of said support substrate,
    wherein the reflecting layer comprises a rare earth metal blended with Ag.

2. The nitride-based compound semiconductor light emitting device according to claim 1, wherein said nitride-based compound semiconductor layer has at least a P-type layer, a light emitting layer and an N-type layer stacked in this order from a side facing the support substrate.

3. The nitride-based compound semiconductor light emitting device according to claim 1, wherein said support substrate is conductive and formed of at least one of Si, GaAs and GaP, and has resistivity in a range from $10^{-4}$ Ωcm to 10 Ωcm.

4. The nitride-based compound semiconductor light emitting device according to claim 1, wherein said support substrate is conductive and formed of at least one of CuW, CuAg and CuMo, and has thermal conductivity in a range from 1.5 W/cm·k to 2.5 W/cm·k.

5. The nitride-based compound semiconductor light emitting device according to claim 1, wherein said bonding metal layer consists of at least two layers formed of same or different materials with respect to each other.

6. The nitride-based compound semiconductor light emitting device according to claim 5, wherein the at least two layers of said bonding metal layer are formed of at least two different metals selected from Au, Sn, AuSn and Au—Ge.

7. The nitride-based compound semiconductor light emitting device according to claim 1, wherein said bonding metal layer is formed of a metal selected from Au, Sn, AuSn and Au—Ge.

8. The nitride-based compound semiconductor light emitting device according to claim 1, wherein said second ohmic electrode has a thickness in a range from 1 nm to 15 nm.

* * * * *